United States Patent
Kang et al.

(10) Patent No.: US 9,076,980 B2
(45) Date of Patent: Jul. 7, 2015

(54) ORGANIC LIGHT-EMITTING DISPLAY APPARATUS AND MANUFACTURING METHOD THEREOF

(71) Applicants: Ki-Nyeng Kang, Yongin (KR); Na-Young Kim, Yongin (KR); Keum-Nam Kim, Yongin (KR); Beohm-Rock Choi, Yongin (KR); Soo-Beom Jo, Yongin (KR); Kie-Hyun Nam, Yongin (KR); Young-Min Kim, Yongin (KR)

(72) Inventors: Ki-Nyeng Kang, Yongin (KR); Na-Young Kim, Yongin (KR); Keum-Nam Kim, Yongin (KR); Beohm-Rock Choi, Yongin (KR); Soo-Beom Jo, Yongin (KR); Kie-Hyun Nam, Yongin (KR); Young-Min Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 13/886,480

(22) Filed: May 3, 2013

(65) Prior Publication Data
US 2013/0299790 A1 Nov. 14, 2013

(30) Foreign Application Priority Data

May 8, 2012 (KR) .................. 10-2012-0048828
Mar. 20, 2013 (KR) .................. 10-2013-0029916

(51) Int. Cl.
*H01L 51/52* (2006.01)
*H01L 51/56* (2006.01)

(52) U.S. Cl.
CPC ............ *H01L 51/5203* (2013.01); *H01L 51/56* (2013.01)

(58) Field of Classification Search
CPC ................................... H01L 51/0002
USPC ............................................. 257/40
See application file for complete search history.

(56) References Cited

U.S. PATENT DOCUMENTS

| 5,636,329 | A | 6/1997 | Sukegawa et al. |
| 2012/0162053 | A1 | 6/2012 | Lee et al. |
| 2012/0169229 | A1* | 7/2012 | You et al. ............. 315/51 |
| 2013/0056735 | A1 | 3/2013 | Heo et al. |

FOREIGN PATENT DOCUMENTS

| JP | 8-6059 A | 1/1996 |
| JP | 11-040064 A | 2/1999 |
| JP | 2007-273409 A | 10/2007 |
| KR | 10-2012-0072948 A | 7/2012 |
| KR | 10-2012-0077470 A | 7/2012 |
| KR | 10-2013-0025717 A | 3/2013 |

* cited by examiner

*Primary Examiner* — Lex Malsawma
(74) *Attorney, Agent, or Firm* — Lee & Morse, P.C.

(57) ABSTRACT

An organic light-emitting display apparatus includes a thin film transistor including an active layer, a gate electrode, a source electrode, and a drain electrode, an organic light-emitting device including a pixel electrode connected to the thin film transistor, an intermediate layer including a light-emitting layer, and an opposed electrode, and a first wiring and a second wiring arranged in different layers on a substrate.

11 Claims, 8 Drawing Sheets

ORGANIC LIGHT-EMITTING DISPLAY APPARATUS AND MANUFACTURING METHOD THEREOF

CROSS-REFERENCE TO RELATED PATENT APPLICATIONS

This application claims priority to and the benefit of Korean Patent Application No. 10-2012-0048828, filed on May 8, 2012, in the Korean Intellectual Property Office, and Korean Patent Application No. 10-2013-0029916, filed on Mar. 20, 2013, in the Korean Intellectual Property Office, the disclosures of which are incorporated by reference herein in their entireties.

BACKGROUND

1. Field of the Invention

Embodiments relate to an organic light-emitting display apparatus and a manufacturing method thereof.

2. Description of the Related Art

An organic light-emitting display apparatus may be used in, e.g., televisions, computers, smart phones, and various other devices that include a display in order to display text, an image, etc. An organic light-emitting display apparatus may be made thin and light, and may be a self-emitting device that does not use a backlight. An organic light-emitting display apparatus may be formed as a flexible or transparent apparatus, and is attractive as a next-generation display apparatus for a variety of applications.

SUMMARY

Embodiments are directed to an organic light-emitting display apparatus, including a thin film transistor including an active layer, a gate electrode, a source electrode, and a drain electrode, an organic light-emitting device including a pixel electrode connected to the thin film transistor, an intermediate layer including a light-emitting layer, and an opposed electrode, and a first wiring and a second wiring arranged in different layers on a substrate.

The first wiring may be formed on the same layer as the gate electrode, and the second wiring may be formed on the same layer as the source and drain electrodes.

The substrate may include an active region in which the thin film transistor and the organic light-emitting device are formed, a sealant region outside the active region, and a pad portion region outside the sealant region, and the second wiring may extend from the active region to at least a part of the pad portion region via the sealant region.

The substrate may include an active region in which the thin film transistor and the organic light-emitting device are formed, a sealant region outside the active region, and a pad portion region outside the sealant region, and the second wiring may extend from the active region to at least a part of the sealant region.

The apparatus may further include at least one plug that electrically connects the first wiring and the second wiring that are overlapped with each other.

The substrate may include the active region in which the thin film transistor and the organic light-emitting device are formed, the sealant region outside the active region, and the pad portion region outside the sealant region, and the at least one plug may be located in at least one of the active region, the sealant region, and a boundary region between the active region and the sealant region.

The apparatus may further include an inorganic film that is formed on the opposed electrode.

The substrate may include an active region in which the thin film transistor and the organic light-emitting device are formed, a sealant region outside the active region, and a pad portion region outside the sealant region, and the inorganic film may be formed from the active region to the sealant region.

The apparatus may further include a sealant formed on the inorganic film in the sealant region.

Embodiments are also directed to a method of manufacturing an organic light-emitting display apparatus, the method including a first mask process of forming an active layer of a thin film transistor on a substrate, a second mask process of forming a first insulation layer covering the active layer and forming a gate electrode of the thin film transistor, a pixel electrode of an organic light-emitting device, and a first wiring on the first insulation layer, a third mask process of forming a second insulation layer covering the gate electrode, the pixel electrode, and the first wiring, exposing a part of the active layer by removing a part of the first insulation layer and a part of the second insulation layer, and exposing a part of the pixel electrode by removing another part of the second insulation layer, a fourth mask process of forming source and drain electrodes that contact an exposed part of the active layer, and a second wiring on the second insulation layer, and a fifth mask process of forming a pixel definition layer that covers an exposed part of the pixel electrode, the source and drain electrodes, and the second wiring, and exposing a part of the pixel electrode and a part of the second wiring by removing a part of the pixel definition layer.

The substrate may include an active region in which the thin film transistor and the organic light-emitting device are formed, a sealant region outside the active region, and a pad portion region outside the sealant region, and, in the fourth mask process, the second wiring may extend from the active region to at least a part of the pad portion region via the sealant region on the second insulation layer.

The substrate may include an active region in which the thin film transistor and the organic light-emitting device are formed, a sealant region outside the active region, and a pad portion region outside the sealant region, and, in the fourth mask process, the second wiring may extend from the active region to at least a part of the sealant region on the second insulation layer.

In the third mask process, a part of the first wiring may be further exposed by removing another part of the second insulation layer in at least one of the active region, the active region, and a boundary region between the active region and the sealant region, and, in the fourth mask process, a plug that contacts an exposed part of the first wiring may be further formed and the second wiring contacts the plug.

The method may further include, after the fifth mask process, forming an intermediate layer covering an exposed part of the pixel electrode, forming an opposed electrode covering the pixel definition layer, the intermediate layer, and a part of the exposed part of the second wiring, and forming an inorganic film covering the opposed electrode and another part of the exposed part of the second wiring.

The substrate may include an active region in which the thin film transistor and the organic light-emitting device are formed, a sealant region outside the active region, and a pad portion region outside the sealant region, and the inorganic film may be formed from the active region to the sealant region.

In the forming of the inorganic film, the inorganic film may be formed by using a mask in which portions corresponding to the active region and the sealant region are open and a portion corresponding to the pad portion region is shielded.

BRIEF DESCRIPTION OF THE DRAWINGS

Features will become apparent to those of skill in the art by describing in detail example embodiments with reference to the attached drawings in which.

DETAILED DESCRIPTION

Figure 1:
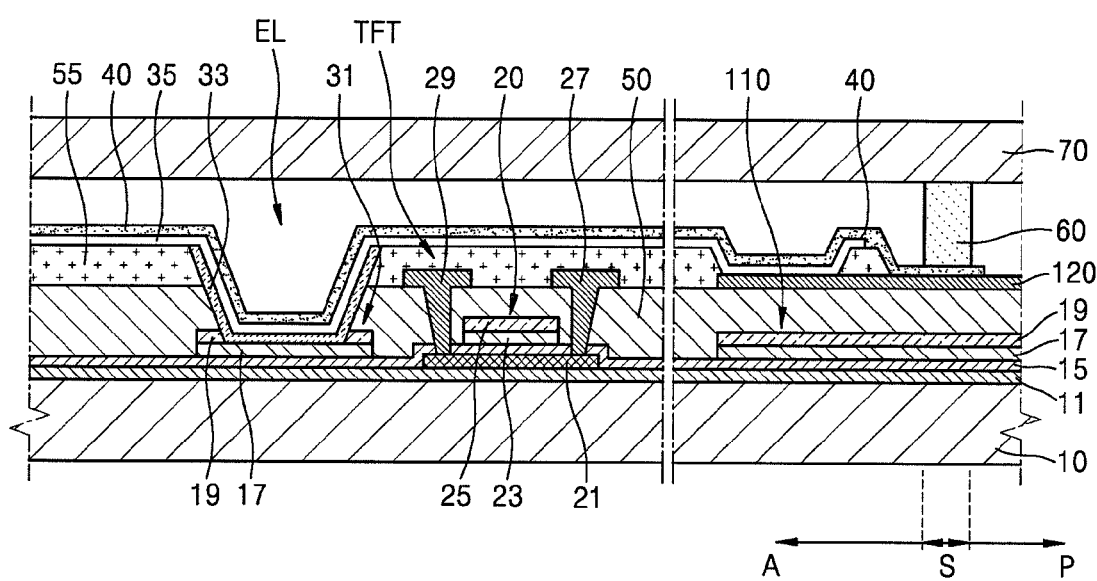
FIG. 1 is a cross-sectional view schematically illustrating an organic light-emitting display apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. Like reference numerals refer to like elements throughout.

FIG. 1 is a cross-sectional view schematically illustrating an organic light-emitting display apparatus according to an example embodiment.

In the example embodiment shown in FIG. 1, the organic light-emitting display apparatus includes, on a substrate 10, an active region A where a thin film transistor (TFT) and an organic light-emitting device (EL) are formed, a sealant region S where a sealant 60 is coated to attach a glass substrate 70 to the substrate 10 outside the active region A, and a pad portion region P connected to a drive circuit portion (not shown) outside the sealant region S.

In a structure of the active region A, the TFT includes an active layer 21, a gate electrode 20, and source and drain electrodes 27 and 29. The gate electrode 20 includes a lower gate electrode 23 and an upper gate electrode 25. The lower gate electrode 23 is formed of a transparent conductive material. A gate insulation film 15 (hereinafter, referred to as the first insulation layer) for insulation between the gate electrode 20 and the active layer 21 is interposed therebetween. Also, a source area and a drain area in which impurities of a high concentration are injected is formed at both sides of the active layer 21 and is connected to the source and drain electrodes 27 and 29.

The EL includes a pixel electrode 31 that is connected to one of the source and drain electrodes 27 and 29 of the TFT, an opposed electrode 35 functioning as a cathode, and an intermediate layer 33 interposed between the pixel electrode 31 and the opposed electrode 35.

In the present example embodiment, a first wiring 110 and a second wiring 120 used as wirings for transmitting power or a control signal provided by the drive circuit portion to the TFT and the EL are arranged in different layers. In some example embodiments, the first wiring 110 may be arranged on the first insulation layer 15 that is the same layer as the gate electrode 20, whereas the second wiring 120 may be arranged on the second insulation layer 50 that is the same layer as the source electrode 27 and the drain electrode 29. As such, the arrangement structure in which wirings are scattered and arranged in different layers may secure a relatively wider wiring width compared to a structure in which wirings are densely arranged in a single layer. Thus, resistance heat, e.g., Joule heating, occurring during driving may be reduced.

The first wiring 110 and the second wiring 120 each may extend from the active region A to the pad portion region P via the sealant region S so as to be electrically connected to the drive circuit portion that is arranged in the pad portion region P.

Although FIG. 1 illustrates that the first wiring 110 and the second wiring 120 (which are arranged at positions corresponding to each other in different layers) are overlapped with each other in the entire area of the active region A, the sealant region S, and the pad portion region P, embodiments are not limited thereto. The first wiring 110 and the second wiring 120 may be arranged to be partially overlapped with each other in different layers. Accordingly, the first wiring 110 and the second wiring 120 may be overlapped with each other in at least one of the active region A, the sealant region S, and the pad portion region P.

In the present example embodiment, an inorganic film 40 is formed on the opposed electrode 35. In some example embodiments, the inorganic film 40 may be formed from the active region A to the sealant region S. Thus, the inorganic film 40 may be formed to cover the opposed electrode 35 in the active region A and the second wiring 120 in the sealant region S.

As such, since the inorganic film 40 prevents intrusion of external moisture, oxygen, gas, etc. into the opposed electrode 35 and the second wiring 120 in the inside of the pad portion region P, that is, in the active region A and the sealant region S, the quality of the organic light-emitting display apparatus may be improved.

Although it is not illustrated in FIG. 1, an organic or inorganic insulation layer (not shown) may be further formed on the second wiring 120 that is exposed from the inorganic film 40 in the pad portion region P. Since the second wiring 120 is not exposed directly to the outside, the second wiring 120 that is exposed from the inorganic film 40 may be prevented from being corroded.

The sealant 60 may be further formed on the inorganic film 40 in the sealant region S. The substrate 10 and the glass substrate 70 may be combined to each other via the sealant 60.

A method of manufacturing an organic light-emitting display apparatus will now be described in detail with reference to FIGS. 2A through 2H. FIGS. 2A through 2H are cross-sectional views sequentially illustrating stages in an example method of manufacturing the organic light-emitting display apparatus of FIG. 1.

Figure 2A:
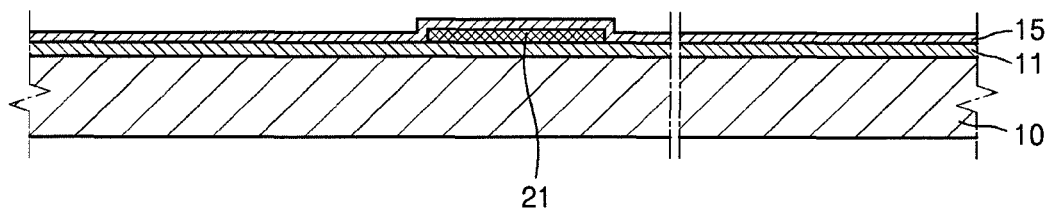
FIGS. 2A through 2H are cross-sectional views sequentially illustrating an example method of manufacturing the organic light-emitting display apparatus of FIG. 1.

Referring to FIG. 2A, a buffer layer 11 to level a surface of the substrate 10 and prevent intrusion of impurity elements is formed on the substrate 10. The substrate 10 is formed of a transparent glass material containing $SiO_2$ as a main component. The substrate 10 is not limited thereto, and a variety of materials such as a transparent plastic or metal material may be used for the substrate 10.

The active layer 21 of the TFT is formed on the buffer layer 11. The active layer 21 may be formed, for example, in a process of forming a polycrystalline silicon layer on the buffer layer 11 and then etching the polycrystalline silicon layer using a first mask (not shown).

The first insulation layer 15 is formed to cover the active layer 21. The first insulation layer 15 may be formed by depositing an inorganic insulation film such as $SiN_x$ or $SiO_x$ in a method such as a plasma-enhanced chemical vapor deposition (PECVD) method, an atmospheric pressure chemical vapor deposition (APCVD) method, a low-pressure chemical vapor deposition (LPCVD) method, etc. The first insulation layer 15 is interposed between the gate electrode 20 and the active layer 21 of the TFT and functions as a gate insulation film of the TFT.

Figure 2B:
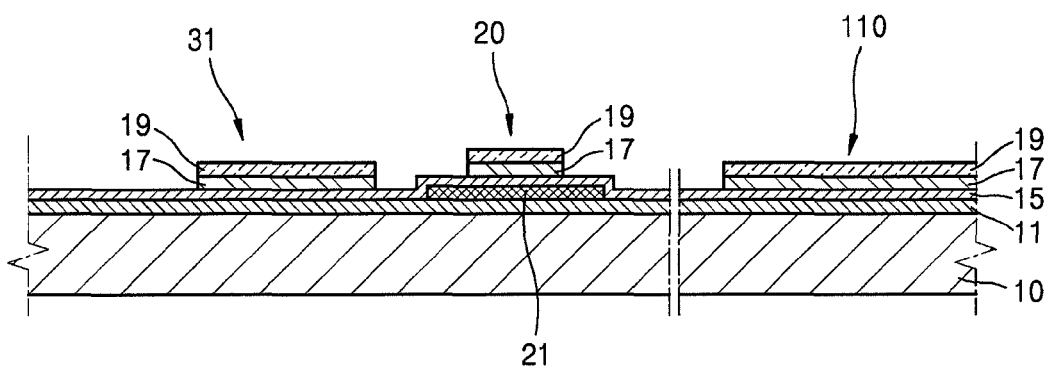

As illustrated in FIG. 2B, after first and second conductive layers 17 and 19 are sequentially deposited on the first insulation layer 15, the pixel electrode 31 of the EL and the gate electrode 20 of the TFT, and the first wiring 110 to be used as a power wiring or a control signal wiring are formed. In detail, the first conductive layer 17 and the second conductive layer 19 formed on the upper surface of the substrate 10 are patterned by using a second mask (not shown) and thus the gate electrode 20, the pixel electrode 31, and the first wiring 110 are formed.

The first conductive layer 17 may include one or more transparent materials such as ITO, IZO, ZnO, $In_2O_3$, etc. The second conductive layer 19 may include one or more materials such as Ag, Mg, Al, Pt, Pd, Au, Ni, Nd, Ir, Cr, Li, Ca, Mo, Ti, W, MoW, Al/Cu, etc.

The gate electrode 20 is formed on the first insulation layer 15 at a position corresponding to the center of the active layer 21. In this state, when the active layer 21 is doped with n-type or p-type impurities by using the gate electrode 20 as a mask, a channel area is formed in an area of the active layer 21 covered by the gate electrode 20 and a source area and a drain area are formed in an edge area of the active layer 21 that is not covered by the gate electrode 20. The first wiring 110 may extend from the active region A to the pad portion region P via the sealant region S.

Figure 2C:
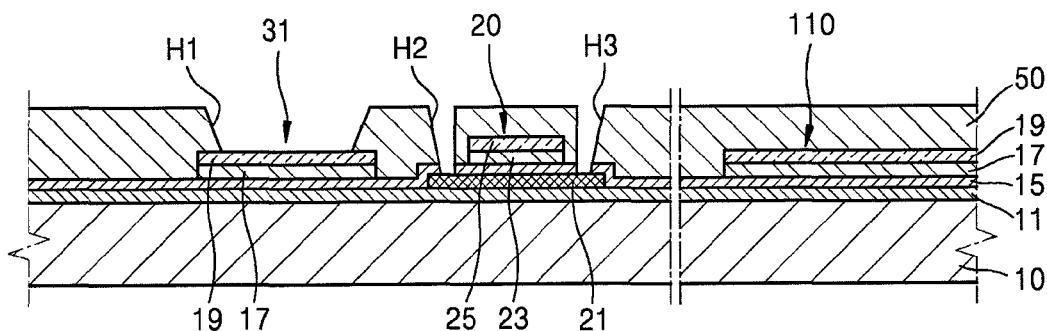

Referring to FIG. 2C, a second insulation layer 50 is formed on the first insulation layer 15 to cover the gate electrode 20, the first insulation layer 15, and the first wiring 110. Openings H1, H2, and H3 are formed by an etch process using a third mask (not shown). In detail, the opening H1 that exposes a part of the pixel electrode 31 is formed by removing a part of the first insulation layer 15 and the second insulation layer 50. Then, the openings H2 and H3 that expose a part of the active layer 21 are formed by removing the other part of the first insulation layer 15.

The second insulation layer 50 may be formed by spin coating one or more organic insulation materials such as polyimide, polyamide, acryl resin, benzocyclobutene, phenol resin, etc. In the present example embodiment, the second insulation layer 50 is formed thicker than the first insulation layer 15 to function as an interlayer insulation film between the gate electrode 20 and the source and drain electrodes 27 and 29 of the TFT. In an implementation, the second insulation layer 50 may be formed of not only the above-described organic insulation material but also an inorganic insulation material used for the first insulation layer 15. In an implementation, the second insulation layer 50 may be formed by alternately using an organic insulation material and an inorganic insulation material.

Figure 2D:
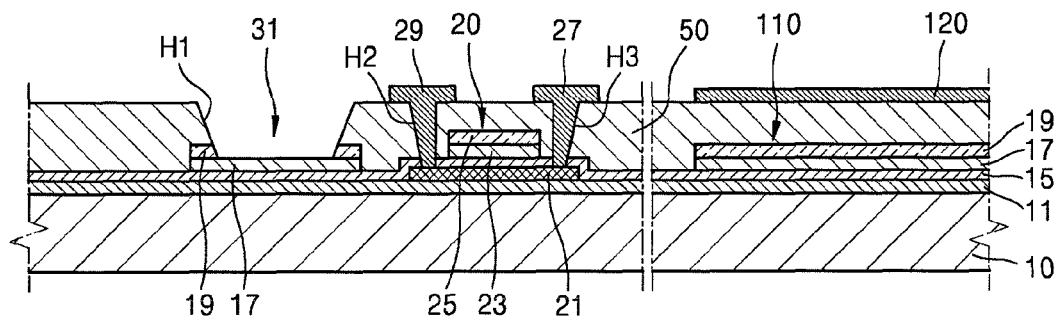

Referring to FIG. 2D, a third conductive layer (not shown) is deposited on the second insulation layer 50, and the source and drain electrodes 27 and 29 and the second wiring 120 are formed in an etching process using a fourth mask (not shown). The third conductive layer may be formed of a conductive material that is the same as those used for the first conductive layer 17 or the second conductive layer 19, or of a Mo/Al/Mo material. The source and drain electrodes 27 and 29 and the second wiring 120 are formed by patterning the third conductive layer. The pixel electrode 31 is etched to expose the first conductive layer 17. Although it is not illustrated in FIG. 2D, any one of the source and drain electrodes 27 and 29 is connected to the pixel electrode 31.

Figure 2E:
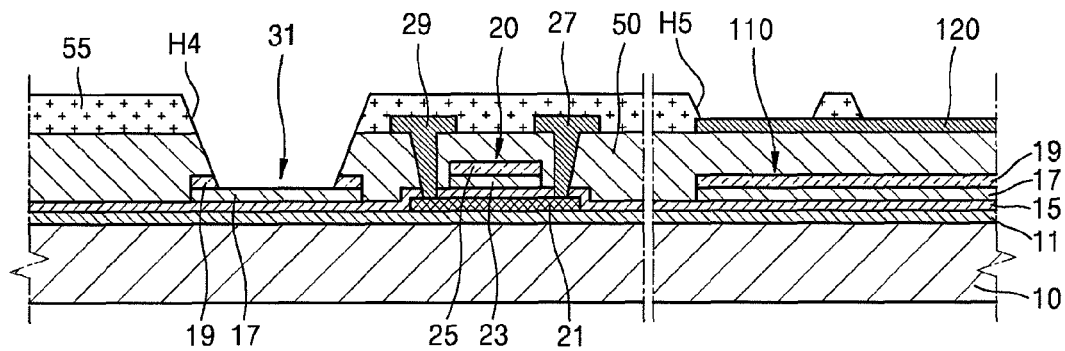

Next, referring to FIG. 2E, a pixel definition layer (PDL) 55 is formed to cover the exposed part of the pixel electrode 31, the source and drain electrodes 27 and 29, and the second wiring 120. The openings H4 and H5 are formed through a mask process using a fifth mask (not shown). In detail, the opening H4 that exposes a part of the pixel electrode 31, that is, the first conductive layer 17 of the pixel electrode 31, and the opening that eposes a part of the second wiring 120, are formed by removing a part of the PDL 55.

The PDL 55 may be formed of one or more organic insulation materials such as polyimide, polyamide, acryl resin, benzocyclobutene, phenol resin, etc., in a method such as spin coating.

Figure 2F:
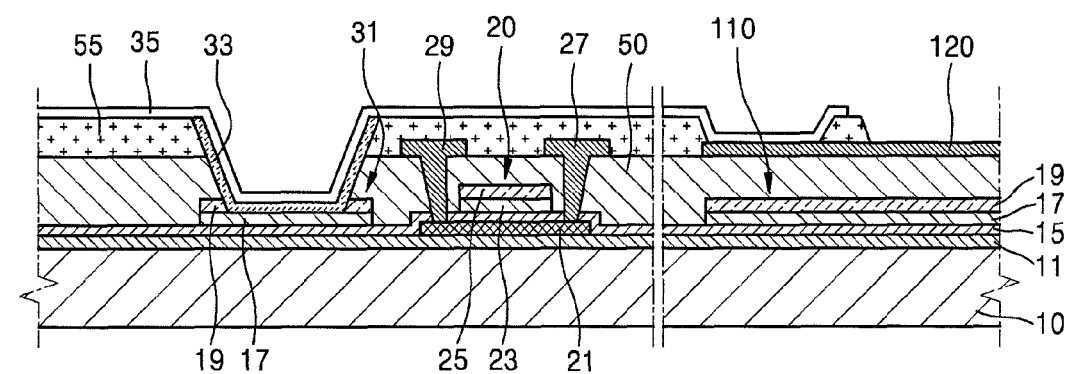

As illustrated in FIG. 2F, the intermediate layer 33, including an organic light-emitting layer, is formed in the opening H4 that exposes the pixel electrode 31. Then, the opposed electrode 35 that covers the PDL 55, the intermediate layer 33, and the second wiring 120 exposed from the PDL 55 in the opening H5 is formed.

The intermediate layer 33 may be formed by stacking one or more layers of functional layers, e.g., an emissive layer (EML), a hole transport layer (HLT), a hole injection layer (HIL), an electron transport layer (ETL), an electron injection layer (EIL), etc., in a single or combined structure.

In the present example embodiment, the opposed electrode 35 is deposited in the active region A of the substrate 10. The opposed electrode 35 and the second wiring 120 are connected to each other via the opening H5. Thus, in the present example embodiment, the second wiring 120 that is formed together with the source and drain electrodes 27 and 29 is used as a power wiring of the opposed electrode 35. The second wiring 120 may be used as other wirings.

A general configuration may contemplate that all wirings are designed with only the first wiring 110 that is formed together with the gate electrode 20. In the present example embodiment, however, the width of each wiring may be sufficiently increased because wirings may be arranged by using not only the first wiring 110 but also the second wiring 120. Since resistance decreases as the width of the wiring increases, a possibility of damaging wiring due to resistance heat may be lowered accordingly.

Figure 2G:
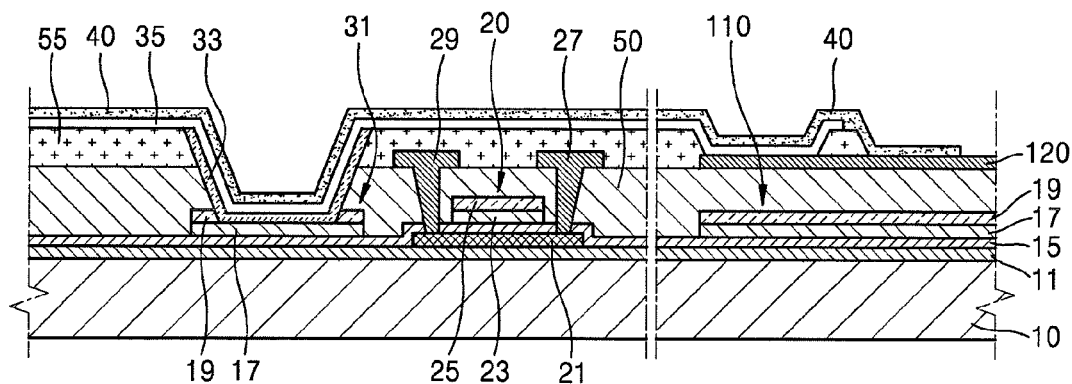

Also in a general configuration in which only the second wiring 120 is formed, external moisture and air may easily intrude through the PDL 55 formed of an organic film material toward the pad portion region P at the edge side of the substrate 10. Accordingly, the opposed electrode 35 and the second wiring 120 may be likely corrode. In the present example embodiment, as illustrated in FIG. 2G, the inorganic film 40 formed of a material such as $SiN_x$ is deposited on the entire surface of the substrate 10 where the opposed electrode 35 is formed. Here, the active region A and the sealant region S, except for the pad portion region P at the edge of the substrate 10, are entirely covered with the inorganic film 40. Accordingly, the inorganic film 40 may partially cover the opposed electrode 35 and the second wiring 120.

Figure 2H:
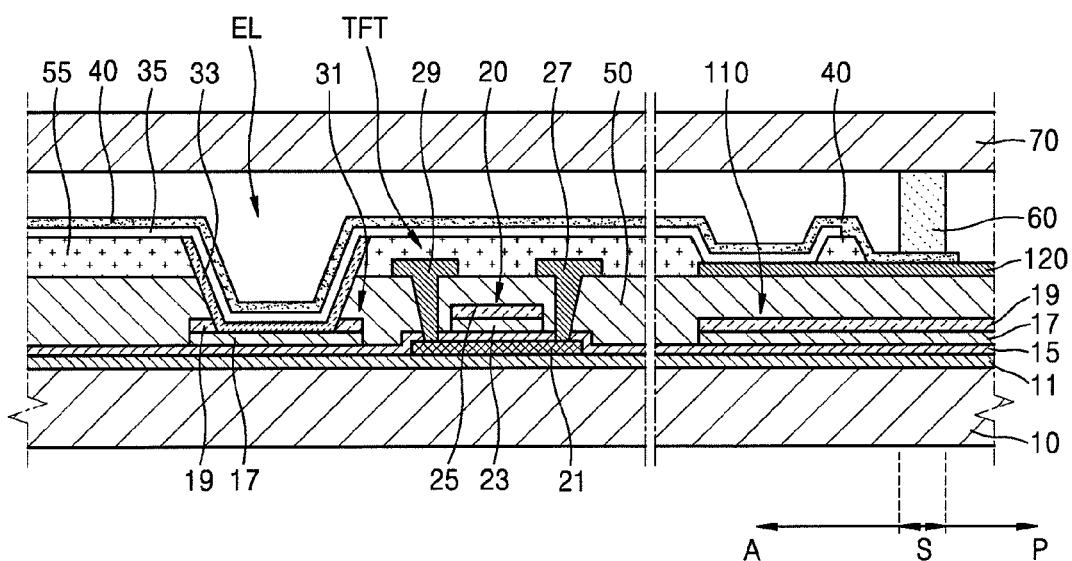
Figure 3:
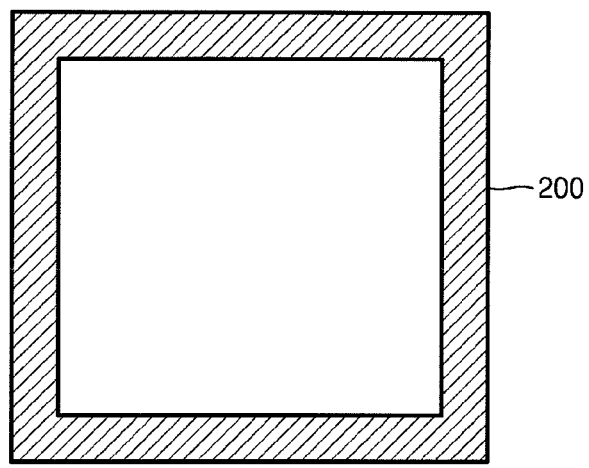
FIG. 3 is a plan view of an open mask.

In doing so, an open mask 200 as illustrated in FIG. 3 is used. The open mask 200 may have a structure in which a portion corresponding to the active region A and the sealant region S is open and a portion corresponding to the pad portion region P of the substrate 10 is shielded. Thus, the active region A where the EL and the TFT exist and the sealant region S to be coated with a sealant 60 (see FIG. 2H) later are entirely covered with the inorganic film 40 while only the pad portion region P on the substrate 10 is covered with the open mask 200. Thus, as wirings may be arranged in a scattered manner by sufficiently using the first and second wrings 110 and 120, resistance heat of a wiring may be reduced. Simultaneously, since a path of moisture intruding into the active region A is blocked by the inorganic film 40, a degradation of quality due to corrosion may be prevented.

As illustrated in FIG. 2H, the sealant 60 is coated on the inorganic film 40 in the sealant region S, and the glass substrate 70 is attached on the sealant, thereby sealing the active region A. A moisture-absorbing filling member (not shown) may be formed in a space between the glass substrate 70 and the substrate 10. An outgasing phenomenon of the filling member may have an ill influence on the opposed electrode 35. However, in the present example embodiment, since the opposed electrode 35 is protected by being covered with the inorganic film 40, the filling member may be freely installed even in view of the outgasing phenomenon.

Since the wirings may be arranged in a scattered manner in the first and second wirings 110 and 120 through the above processes, an efficient structure to remove a problem of resistance heat as well as the concern about wiring corrosion may be embodied.

Thus, according to an organic light-emitting display apparatus and a manufacturing method thereof according to example embodiments, various wirings including a power wiring and a control signal wiring may be arranged in a scattered manner not only in a layer where a gate electrode is formed but also in a layer where a source electrode and a drain electrode are formed, and the width of wiring may be increased and thus resistance may be reduced. Accordingly, a possibility of damaging wiring due to resistance heat may be reduced. Also, since a cathode (an opposed electrode) in an active region is entirely covered with an inorganic film, a possibility of a gas generated from a filling member between a substrate and a glass substrate having an ill influence on the cathode may be prevented.

Figure 4:
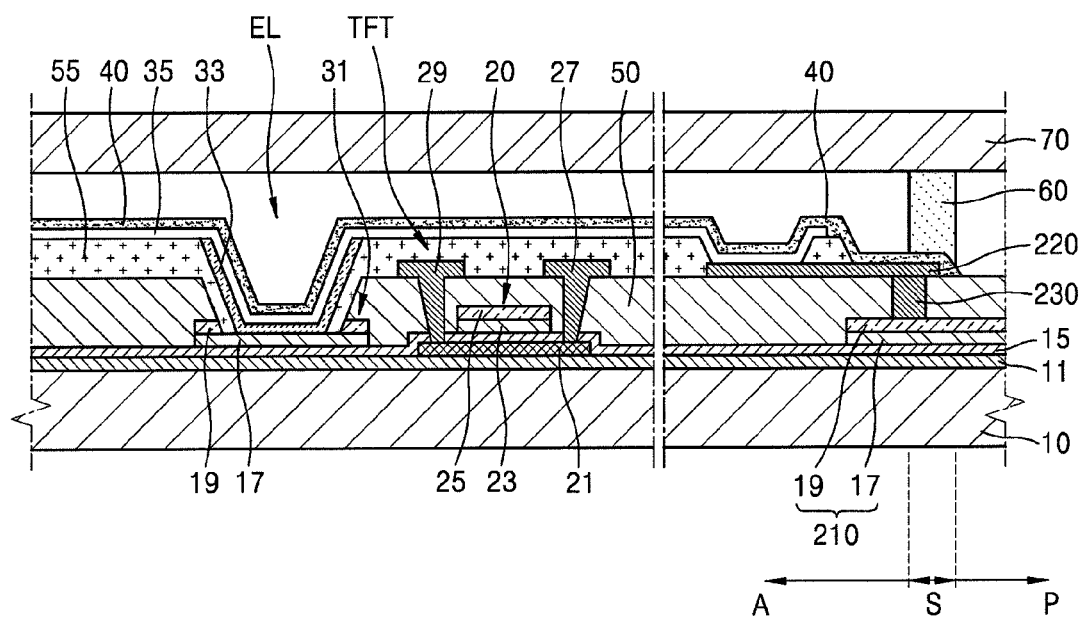
FIG. 4 is a cross-sectional view illustrating an organic light-emitting display apparatus according to another example embodiment.

FIG. 4 is a cross-sectional view illustrating an organic light-emitting display apparatus according to another example embodiment. In the description of FIG. 4, reference numerals that are the same as or correspond to those of FIG. 1 denote the same or corresponding constituent elements. For convenience of explanation, details may not be repeated and differences are discussed below.

In the example embodiment shown in FIG. 4, a first wiring 210 and a second wiring 220 are arranged in different layers. For example, the first wiring 210 may be arranged in the first insulation layer 15, whereas the second wiring 220 may be arranged in the second insulation layer 50.

The first wiring 210 and the second wiring 220 are arranged in different layers to be partially overlapped with each other. In some example embodiments, the first wiring 210 may extend from the active region A to the pad portion region P via the sealant region S on the first insulation layer 15 so as to be electrically connected to the drive circuit portion (not shown) arranged in the pad portion region P, whereas the second wiring 220 may extend from the active region A to at least a part of the sealant region S on the second insulation layer 50. Accordingly, the first wiring 210 and the second wiring 220 may be overlapped with each other in the active region A and the sealant region S.

However, embodiments are not limited thereto. In other example embodiment, the first wiring 210 may extend from the sealant region S to the pad portion region P on the first insulation layer 15, whereas the second wiring 220 may extend from the active region A to at least a part of the sealant region S on the second insulation layer 50. In this case, the first wiring 210 and the second wiring 220 may be overlapped with each other only in the sealant region S. In another example embodiment, the first wiring 210 may extend from the active region A to the pad portion region P via the sealant region S on the first insulation layer 15, whereas the second wiring 220 may extend from the active region A to a boundary region between the active region A and the sealant region S on the second insulation layer 50. In this case, the first wiring 210 and the second wiring 220 may be overlapped with each other only in the active region A adjacent to the boundary region between the active region A and the sealant region S.

In the present example embodiment, the first wiring 210 and the second wiring 220 are electrically connected to each other by a plug 230 extending to penetrate the second insulation layer 50. The plug 230 is located in an area where the first wiring 210 and the second wiring 220 are overlapped with each other. In some example embodiments, as illustrated in FIG. 4, the plug 230 may be located in the boundary region between the active region A and the sealant region S. However, embodiments are not limited thereto and the plug 230 may be located only in the active region A or in the sealant region S.

FIG. 4 illustrates that the organic light-emitting display apparatus is provided with only one plug 230, but embodiments are not limited thereto. The organic light-emitting display apparatus may include a plurality of plugs. In this case, like the above-described plug 230, the plug 230 may be located in any one of the active region A, the sealant region S, and the boundary region between the active region A and the sealant region S.

Likewise, as the second wiring 220 is arranged only to the sealant region S on the second insulation layer 50 and is electrically connected to the first wiring 210 via the plug 230, the first wiring 210 and the second wiring 220 may be used as wirings to transmit power or control signals provided from the drive circuit portion to the organic light-emitting display apparatus.

The opposed electrode 35 is formed on the PDL 55, the intermediate layer 33, and the second wiring 220 that is exposed in the active region A. The inorganic film 40 is formed on the opposed electrode 35 and the second wiring 220 in the active region A and on the second wiring 220 in the sealant region S. As the second wiring 220 is arranged from the active region A to a part of the sealant region S, the inorganic film 40 may be formed to entirely cover the second wiring 220.

In the present example embodiment, as the inorganic film 40 entirely covers the second wiring 220, the second wiring 220 may be prevented from being exposed to a corrosion environment due to a non-film forming area at a boundary region between the sealant region S and the pad portion region P.

As a result, in the organic light-emitting display apparatus, as wirings may be arranged in a scattered manner in different layers, not only design of the organic light-emitting display apparatus is made easy, but also resistance heat generated during driving may be reduced, compared to a case in which the wirings are concentrated in a single layer. Simultaneously, since the cathode (opposed electrode) and the wirings (e.g., the second wiring formed in the same layer as the source electrode and the drain electrode) are protected by the inorganic film, degradation of quality due to moisture, oxygen, external gas, etc., may be prevented.

FIGS. 5A through 5G are cross-sectional views sequentially illustrating an example method of manufacturing the organic light-emitting display apparatus of FIG. 4. In the description of FIGS. 5A through 5G, reference numerals that are the same as or correspond to those of FIGS. 2A through 2H denote the same or corresponding constituent elements. For convenience of explanation, details may not be repeated and differences are discussed below.

Figure 5A:
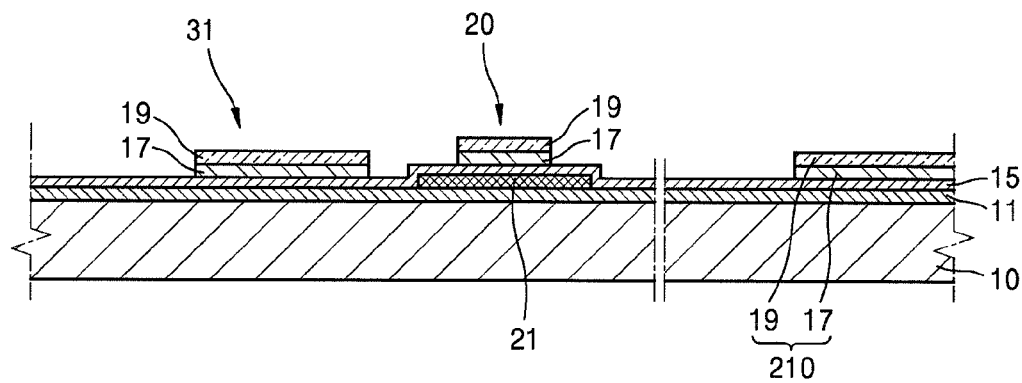
FIGS. 5A through 5G are cross-sectional views sequentially illustrating stages in an example method of manufacturing the organic light-emitting display apparatus of FIG. 4.

Referring to FIG. 5A, the buffer layer 11 is formed on the substrate 10 and the active layer 21 of the TFT is formed on the buffer layer 11 in an etching process using the first mask (not shown). Next, the first insulation layer 15 covering the active layer 21 is formed and the first and second layers 17 and 19 are sequentially formed on the first insulation layer 15. Then, the gate electrode 20 of the TFT, the pixel electrode 31 of the EL, and the first wiring 210 are formed in the etching process using the second mask (not shown). The first wiring 210 may extend from the active region A of the substrate 10 to the pad portion region P via the sealant region S.

Figure 5B:
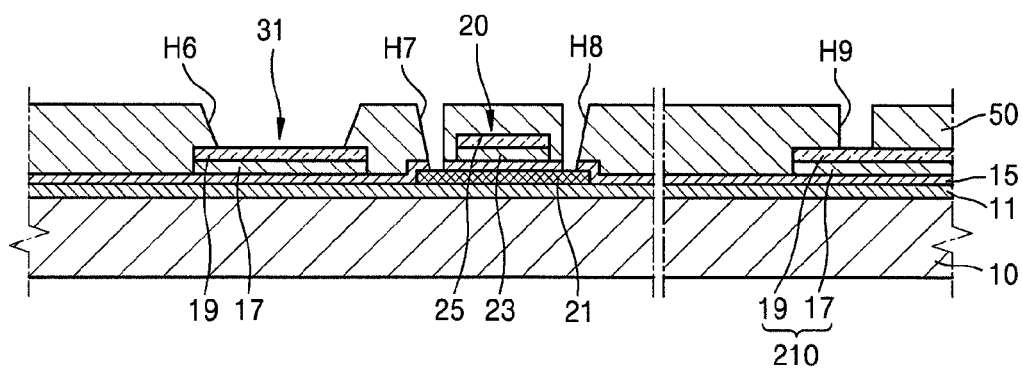

Referring to FIG. 5B, the second insulation layer 50 covering the gate electrode 20, the pixel electrode 31, and the first wiring 210 is formed on the first insulation layer 15. Openings H6, H7, H8, and H9 are formed in the second insulation layer 50 according to an etching process using the third mask (not shown).

In detail, the opening H6 that exposes a part of the pixel electrode 31 is formed by removing a part of the first insulation layer 15 and a part of the second insulation layer 50. The openings H7 and H8 that expose a part of the active layer 21 are formed by removing a part of the second insulation layer 50. The opening H9 that exposes a part of the first wiring 210 is formed by removing another part of the second insulation layer 50.

The opening H9 is formed in any one of the active region A, the sealant region S, and the boundary region between the active region A and the sealant region S on the substrate 10. Accordingly, the first wiring 210 may be exposed from the second insulation layer 50. On the other hand, like the opening H9, a plurality of openings that expose the first wiring 210 from the second insulation layer 50 may be further formed. The openings may be formed in at least one of the active region A, the sealant region S, and the boundary region between the active region A and the sealant region S on the substrate 10.

Figure 5C:
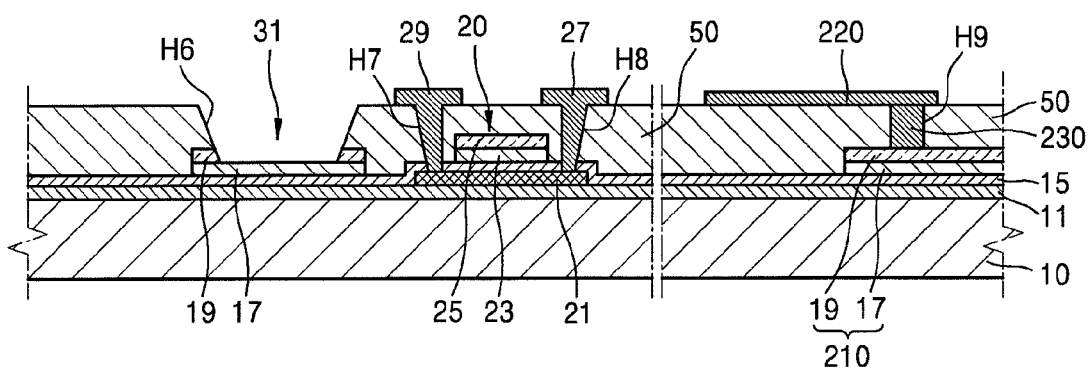

Referring to FIG. 5C, a predetermined conductive material layer is formed on the second insulation layer 50. The source and drain electrodes 27 and 29 and the second wiring 220 are formed by an etching process using the fourth mask (not shown). In detail, plugs of the source and drain electrodes 27 and 29 are formed by filling the openings H8 and H7 with the conductive material and simultaneously a plug 230 is formed by filling the opening H9 with the conductive material. Then, the conductive material layer covering the second insulation layer 50 is formed. The source and drain electrodes 27 and 29 contacting the plugs of the source and drain electrodes 27 and 29 and the second wiring 220 contacting the plug 230 are formed by an etching process using the fourth mask. In the etching process, the first conductive layer 17 is exposed by removing a part of the second conductive layer 19 of the pixel electrode 31.

The second wiring 220 may extend from the active region A to at least a part of the sealant region S on the substrate 10. The second wiring 220 may be electrically connected to the first wiring 210 via the plug 230.

Figure 5D:
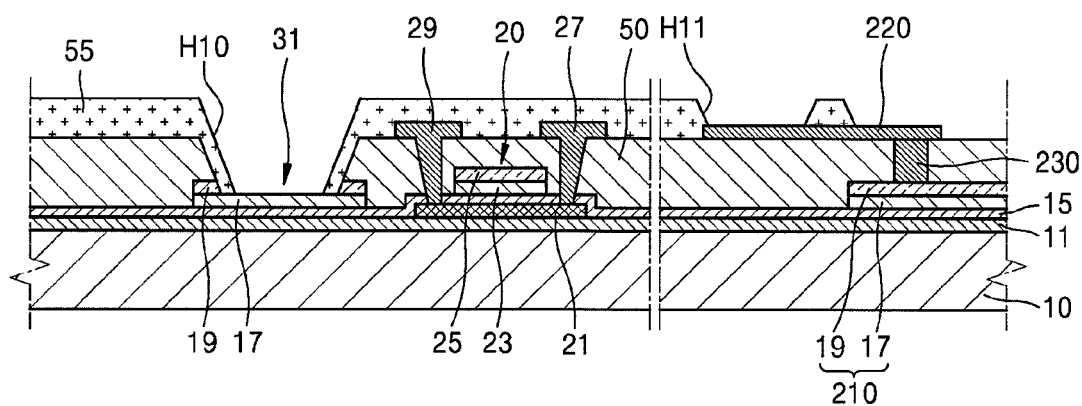

Referring to FIG. 5D, the PDL 55 covering the exposed part of the pixel electrode 31, the source and drain electrodes 27 and 29, and the second wiring 220 is formed. Openings H10 and H11 are formed by an etching process using the fifth mask (not shown). In detail, the opening H10 that exposes a part of the pixel electrode 31, that is, the first conductive layer 17 of the pixel electrode 31, and the opening H11 that exposes a part of the second wiring 220, are formed by removing a part of the PDL 55.

Figure 5E:
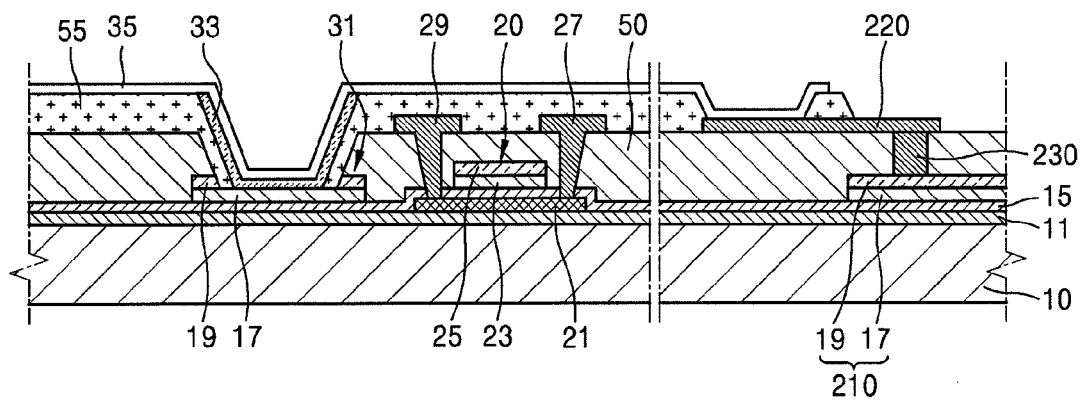

Referring to FIG. 5E, the intermediate layer 33 including an organic light-emitting layer is formed in the opening H10. The opposed electrode 35 covering the intermediate layer 33, the PDL 55, and the second wiring 220 that is exposed from the PDL 55 in the opening H11 is formed. In the present example embodiment, as the opposed electrode 35 is connected to the second wiring 220, the first wiring 210 and the second wiring 220 that are electrically connected to each other via the plug 230 are used as a power wiring of the opposed electrode 35. As the above power wiring structure is adopted, wiring design is made easy and resistance may be reduced as a wiring width increases.

Figure 5F:
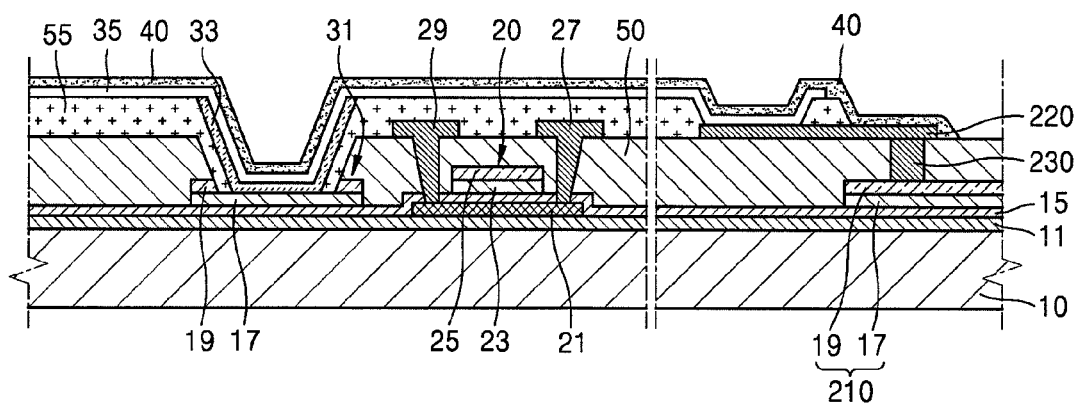

Referring to FIG. 5F, the inorganic film 40 covering the opposed electrode 35 and the second wiring 220 is formed. The above-described open mask 200 (refer to FIG. 3) may be used when the inorganic film 40 is formed. Accordingly, the inorganic film 40 may be entirely formed in the active region A and the sealant region S, except for the pad portion region P. The opposed electrode 35 and the second wiring 220 are entirely covered by the inorganic film 40. Accordingly, in the organic light-emitting display apparatus, since the corrosion of the opposed electrode 35 and the second wiring 220 is prevented by the inorganic film 40, degradation of quality may be prevented.

Figure 5G:
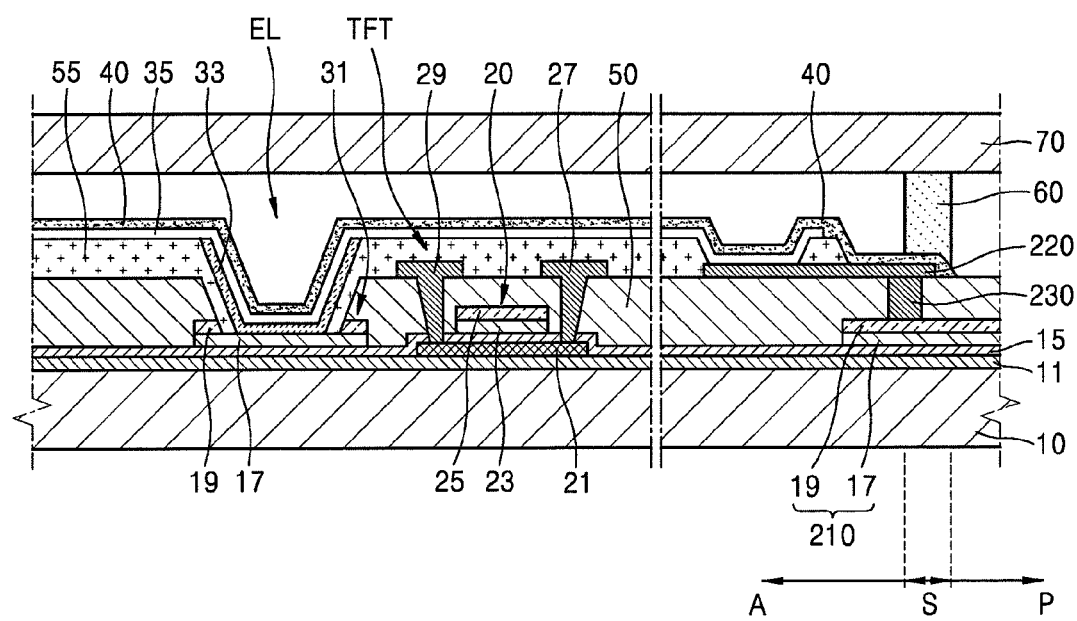

Referring to FIG. 5G, the sealant 60 may be further formed on the inorganic film 40 in the sealant region S. The substrate 10 and the glass substrate 70 may be combined to each other via the sealant 60 and thus the active region A is hermetically sealed.

By way of summation and review, an organic light-emitting display apparatus may have a structure including thin film transistors and organic light-emitting devices to form a desired image as an organic light-emitting device receives an appropriate drive signal from a thin film transistor and emits light. The thin film transistor may have a structure in which an active layer, a gate electrode, a source electrode, and a drain electrode are stacked on a substrate. When current is applied to the gate electrode via wiring formed on the substrate, the current may flow toward the source electrode and the drain electrode via the active layer and simultaneously to a pixel electrode of an organic light-emitting device that is connected to the source electrode and the drain electrode. The organic light-emitting device may include the pixel electrode, an opposed electrode facing the pixel electrode, and a light-emitting layer interposed between the two electrodes. In the structure, when current flows in the pixel electrode through the thin film transistor as described above, an appropriate voltage may be formed between the opposed electrode and the pixel electrode and thus light emission occurs in the light-emitting layer to form an image.

The organic light-emitting display apparatus may include various wirings such as a power wiring for applying a voltage to the source electrode and the drain electrode, the opposed electrode, etc., and a signal wiring for sending a control signal to the gate electrode of the thin film transistor, etc. Generally, these wirings may all be formed from a layer with which the gate electrode is formed. For example, while a gate electrode is formed, the wirings may all be formed from the same layer by using the same material. Although there is a source/drain electrode layer where the source electrode and the drain electrode are formed, as another conductive layer, the source/drain electrode layer may not be used as a wiring layer due to a possibility of erosion. Thus, wiring on the source/drain electrode layer may be formed of a Mo/Al/Mo material and may be easily galvanically corroded when exposed to water. Also, a pixel definition layer that is formed after the wiring on the source/drain electrode layer may be formed using an organic layer like polyimide, such that intrusion of moisture into the source/drain electrode layer may not be prevented well. Although external air and moisture may be prevented from intruding by coating a sealant around an active region on the substrate including the organic light-emitting device and the thin film transistor and covering a sealed region with a glass substrate later, the may still be a possibility of intrusion of moisture through a sealant area of the glass substrate and thus it may be difficult to use the wiring on the source/drain electrode layer. Therefore, all wirings may be formed on a layer where the gate electrode layer is formed. When wirings are densely formed from a single layer with a limited space, the width of each wiring may be reduced when designing a circuit so that resistance of each wiring increases and significant resistance heat may be generated. Such resistance heat may damage the wiring.

In order to embody a more stable organic light-emitting display apparatus, various wirings may be formed in a scattered fashion without being densely formed from a single layer. As described above, embodiments relate to an organic light-emitting display apparatus which may reduce resistance heat of wiring. Embodiments may provide an organic light-emitting display apparatus in which various wirings, including a power wiring and a signal wiring in a plurality of layers, may be formed not densely from a single layer, and a manufacturing method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
    a thin film transistor including an active layer, a gate electrode, a source electrode, and a drain electrode;
    an organic light-emitting device including a pixel electrode connected to the thin film transistor, an intermediate layer including a light-emitting layer, and an opposed electrode;
    a substrate that includes an active region in which the thin film transistor and the organic light-emitting device are formed, a sealant region outside the active region, and a pad portion region outside the sealant region, the sealant region being interposed between the pad portion region and the active region; and
    a first wiring and a second wiring arranged in different layers on the substrate, wherein at least one of the first wiring or the second wiring extends across the sealant region and is present in the active region and the pad region.

2. The apparatus as claimed in claim 1, wherein the first wiring is formed on the same layer as the gate electrode, and the second wiring is formed on the same layer as the source and drain electrodes.

3. The apparatus as claimed in claim 1, wherein:
    the second wiring extends across the sealant region and is present in the active region and the pad portion region.

4. The apparatus as claimed in claim 1, wherein:
    the second wiring extends from the active region to at least a part of the sealant region.

5. The apparatus as claimed in claim 4, further comprising at least one plug that electrically connects the first wiring and the second wiring that are overlapped with each other.

6. The apparatus as claimed in claim 5, wherein:
    the at least one plug is located in at least one of the active region, the sealant region, and a boundary region between the active region and the sealant region.

7. The apparatus as claimed in claim 1, further comprising an inorganic film that is formed on the opposed electrode.

8. The apparatus as claimed in claim 7, wherein:
    the inorganic film is formed from the active region to the sealant region.

9. The apparatus as claimed in claim 8, further comprising a sealant formed on the inorganic film in the sealant region.

10. The apparatus as claimed in claim 1, wherein the first wiring extends across the sealant region and is present in the active region and the pad portion region.

11. An organic light-emitting display apparatus, comprising:
    a thin film transistor including an active layer, a gate electrode, a source electrode, and a drain electrode;
    an organic light-emitting device including a pixel electrode connected to the thin film transistor, an intermediate layer including a light-emitting layer, and an opposed electrode;
    a first wiring and a second wiring arranged in different layers on a substrate, and
    at least one plug that electrically connects the first wiring and the second wiring that are overlapped with each other.

* * * * *